United States Patent
Wada et al.

(10) Patent No.: US 9,030,012 B2
(45) Date of Patent: May 12, 2015

(54) SEMICONDUCTOR DEVICE AND MANUFACTURING METHOD THEREOF

(71) Applicant: Kabushiki Kaisha Toshiba, Minato-ku, Tokyo (JP)

(72) Inventors: Makoto Wada, Yokohama (JP); Akihiro Kajita, Yokkaichi (JP); Atsunobu Isobayashi, Yokkaichi (JP); Tatsuro Saito, Yokkaichi (JP); Tadashi Sakai, Yokohama (JP); Taishi Ishikura, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 2 days.

(21) Appl. No.: 14/155,006

(22) Filed: Jan. 14, 2014

(65) Prior Publication Data

US 2015/0035149 A1    Feb. 5, 2015

(30) Foreign Application Priority Data

Aug. 1, 2013  (JP) .................................. 2013-160562

(51) Int. Cl.
| | |
|---|---|
| *H01L 23/52* | (2006.01) |
| *H01L 23/544* | (2006.01) |
| *H01L 23/532* | (2006.01) |
| *H01L 21/768* | (2006.01) |

(52) U.S. Cl.
CPC ........ *H01L 23/544* (2013.01); *H01L 23/53276* (2013.01); *H01L 21/76838* (2013.01)

(58) Field of Classification Search
CPC ......................... H01L 23/544; H01L 23/53276
USPC .......... 257/734, 746, 750, 774, 741; 977/932, 977/742
See application file for complete search history.

(56) References Cited

U.S. PATENT DOCUMENTS

| | | | |
|---|---|---|---|
| 7,060,543 B2 | 6/2006 | Choi et al. | |
| 7,348,675 B2* | 3/2008 | Dubin et al. | ................... 257/774 |
| 8,358,008 B2 | 1/2013 | Wada et al. | |
| 8,405,189 B1* | 3/2013 | Ward et al. | ..................... 257/532 |
| 8,482,126 B2 | 7/2013 | Wada et al. | |
| 8,487,449 B2 | 7/2013 | Wada et al. | |
| 2001/0023986 A1* | 9/2001 | Mancevski | .................... 257/741 |
| 2004/0043219 A1* | 3/2004 | Ito et al. | ........................ 428/408 |
| 2005/0056826 A1* | 3/2005 | Appenzeller et al. | ........... 257/20 |
| 2005/0167755 A1* | 8/2005 | Dubin et al. | ................... 257/368 |
| 2006/0046445 A1 | 3/2006 | Choi et al. | |

(Continued)

FOREIGN PATENT DOCUMENTS

| | | |
|---|---|---|
| JP | 2008-135671 A | 6/2008 |
| JP | 2012-054303 A | 3/2012 |

*Primary Examiner* — Michele Fan
(74) *Attorney, Agent, or Firm* — Holtz, Holtz, Goodman & Chick PC

(57) ABSTRACT

According to one embodiment, a semiconductor device includes a semiconductor substrate provided with a lower interconnect layer formed thereon, and having a device region and a mark formation region, a CNT via structure formed in the device region such that it contacts the lower interconnect layer, a first mark formed in the mark formation region, formed by embedding carbon nanotubes, and formed in the same layer as the CNT via structure, a second mark formed in the mark formation region of the semiconductor substrate, formed with no carbon nanotubes, and formed in the same layer as the CNT via structure and the first mark, and an interconnect layer formed on the CNT via structure and the first and second marks, and electrically connected to the CNT via structure.

13 Claims, 5 Drawing Sheets

(56) References Cited

U.S. PATENT DOCUMENTS

| | | | |
|---|---|---|---|
| 2007/0096616 A1* | 5/2007 | Han et al. ................ | 313/309 |
| 2010/0244262 A1 | 9/2010 | Awano et al. | |
| 2011/0024907 A1* | 2/2011 | Fujiyama ................ | 257/751 |
| 2012/0273455 A1* | 11/2012 | Lackowski et al. ........... | 216/20 |
| 2013/0109170 A1 | 5/2013 | Awano et al. | |

* cited by examiner

US 9,030,012 B2

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2013-160562, filed Aug. 1, 2013, the entire contents of which are incorporated herein by reference.

FIELD

Embodiments described herein relate generally to a semiconductor device having a contact via formed of carbon nanotubes (CNTs), and a method of manufacturing the same.

BACKGROUND

Attempts to use CNTs as a via material for LSI interconnects have recently been activated. CNTs perform ballistic conduction, and therefore can be used as an ultralow resistance material that is to be utilized in place of existing metal materials.

To form a CNT via, a contact groove is formed using a standard LSI process, and then CNTs are embedded into the groove by, for example, chemical vapor deposition (CVD). Subsequently, to remove the part of the CNTs formed in an extra field other than the groove, this part is impregnated with an $SiO_2$ film and then fixed by a spin-on-glass (SOG) film. After that, the CNTs are polished by a chemical mechanical polishing (CMP) planarizing treatment, thereby separating vias. After that, a metal film serving as an upper interconnect is formed to complete a multilayer interconnect structure.

In the above method, CMP is performed to make the CNT film and the SOG film have the same polishing rate. Therefore, not only the surfaces of CNT vias, but also alignment marks for performing lithography alignment on the upper layer interconnect, are inevitably flattened.

When processing the metal film on the upper interconnect by lithography, the alignment marks cannot be seen from the outside because the metal film is also provided on the flattened marks to block the light reflected from the marks. Accordingly, accurate lithography alignment between the CNT vias and the upper interconnect cannot be performed and hence significant misalignment may well occur. This is a serious problem in a leading device structure for which microfabrication is required.

DETAILED DESCRIPTION

In general, according to one embodiment, there is provided a semiconductor device comprising: a semiconductor substrate provided with a lower interconnect layer formed thereon, and having a device region and a mark formation region; a CNT via structure formed in the device region such that it contacts the lower interconnect layer; a first mark formed in the mark formation region, formed by embedding CNTs, and formed in the same layer as the CNT via structure; a second mark formed in the mark formation region of the semiconductor substrate, formed with no CNTs, and formed in the same layer as the CNT via structure and the first mark; and an upper interconnect layer formed on the CNT via structure and the first and second marks, and electrically connected to the CNT via structure.

Semiconductor devices and their manufacturing methods will be described with reference to the accompanying drawings.

First Embodiment

Figure 1:
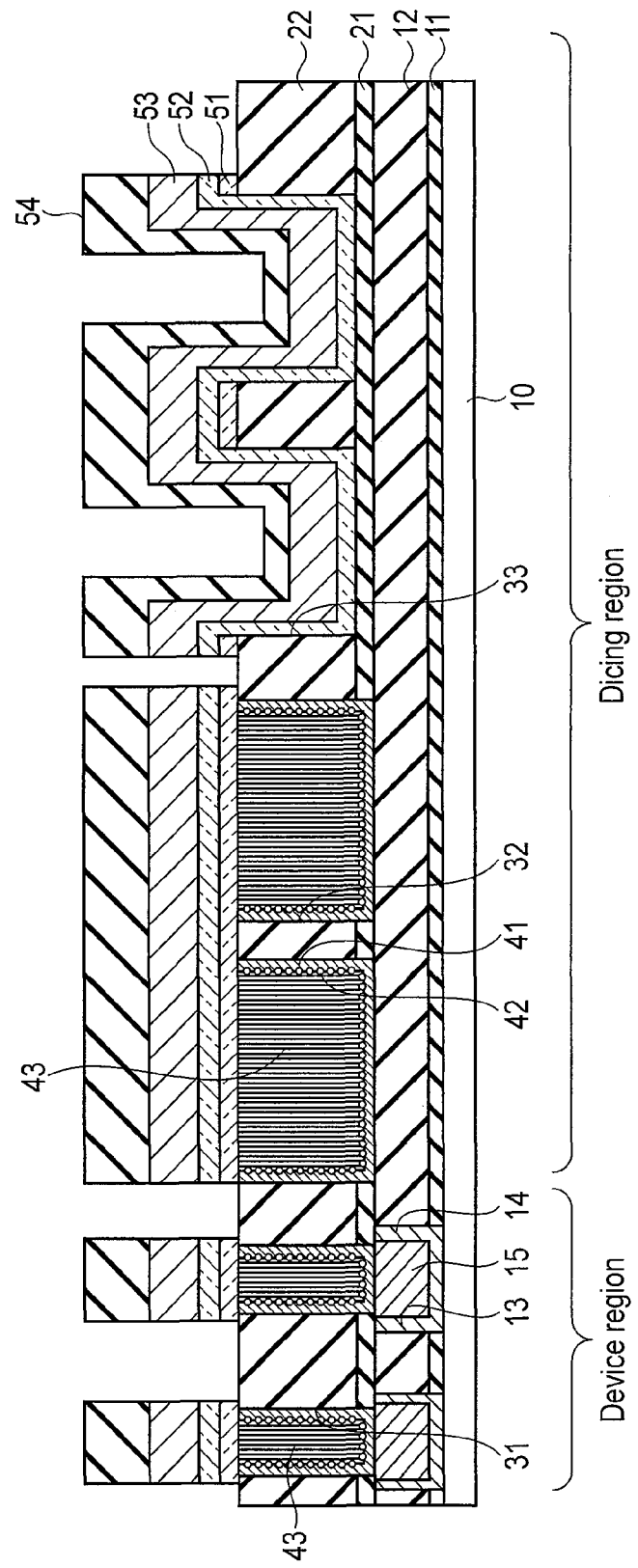
FIG. 1 is a schematic cross-sectional view showing the structure of a semiconductor device according to a first embodiment.

FIG. 1 is a schematic cross-sectional view showing the structure of a semiconductor device with CNT vias, according to a first embodiment.

In the figure, reference number 10 denotes an Si substrate (semiconductor substrate) provided with elements, such as transistors and capacitors. On the substrate 10, a stopper insulating film 11 formed of, for example, SiN, and an interlayer insulating film 12 formed of, for example, $SiO_2$, are provided. Interconnect grooves 13 are formed in the interlayer insulating film 12, and a lower interconnect layer comprising a barrier metal 14 and an interconnect metal 15 is formed in each interconnect groove 13.

A stopper insulating film 21 formed of, for example, SiN, and an interlayer insulating film 22 formed of, for example, $SiO_2$, are provided on the substrate 10 with the lower interconnect layer. Contact grooves 31 are formed in the interlayer insulating film 22 on a device region. First mark grooves 32 and second mark grooves 33 are formed in the interlayer insulating film 22 on a dicing region (mark formation region). CNTs 43 are embedded in each of the contact grooves 31 via an auxiliary catalytic layer 41 formed of, for example, Ti or TiN, and a catalytic layer 42 formed of, for example, Ni or Co. Thus, CNT vias are formed. Further, as in the contact grooves 31, CNTs 43 are embedded in each of the mark grooves 32 via an auxiliary catalytic layer 41 and a catalytic layer 42. Thus, first alignment marks are formed.

Contact layers 51 and 52 formed of, for example, TiN or TiO, an upper interconnect layer 53 formed of, for example, W, and an insulating film 54 formed of, for example, $SiO_2$, are provided on the substrate 10 with the CNT vias and the first alignment marks formed thereon. The upper interconnect layer 53 is also formed within the mark grooves 33, whereby second alignment marks are formed.

Figure 2A:
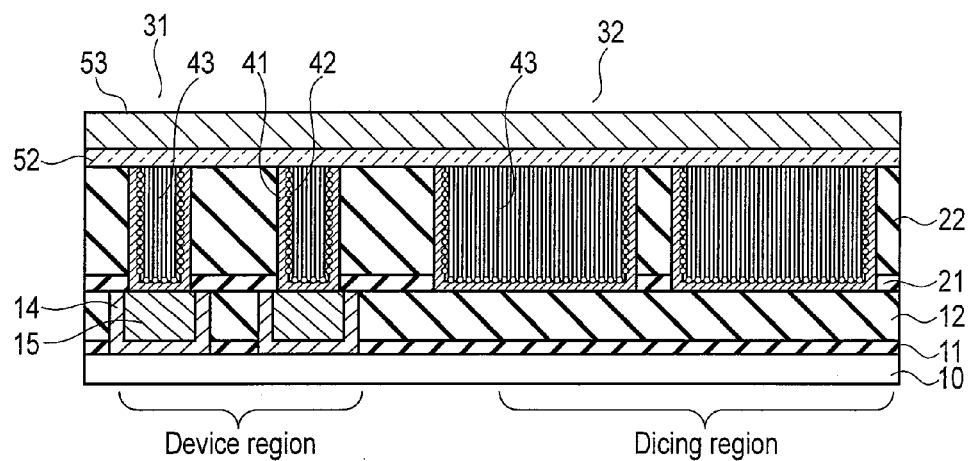
FIGS. 2A and 2B are cross-sectional views showing an alignment mark structure for use in the first embodiment.
Figure 2B:
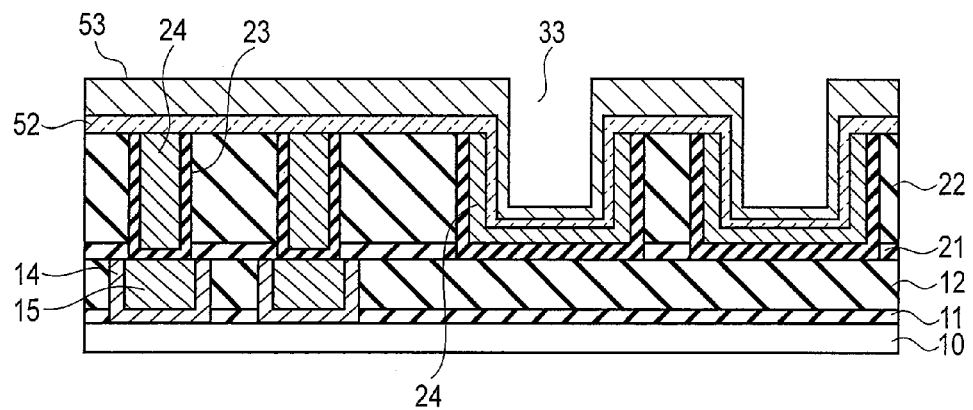

Referring now to FIGS. 2A and 2B, a description will be given of the alignment mark structure employed in the first embodiment.

FIG. 2A shows an example of the mark structure CNT vias. As alignment marks in the dicing region, CNTs 43 are embedded in the mark grooves 32 to have flat surfaces, like the CNT vias in the device region.

In general, alignment marks (grooves) for use in lithography alignment are formed wider than the vias in a device region so that even when a via filling material is buried in the grooves, a step is formed at the center portion of each groove. However, in the case of forming CNT vias, even if the alignment mark groove is formed wide, no step is formed therein since CNTs uniformly grow from the catalytic layer on the groove. Namely, since the CNTs 43 grow from the surface of the catalytic layer 42 and is polished to be flattened to form a via, the mark groove 32 will be filled to have a flat surface even if the mark region is formed wide. Since there is thus no step, no marks can be seen during metal film formation of the upper interconnect layer 53, whereby accurate alignment cannot be realized. As a result, during lithography, the upper interconnect layer cannot be aligned with the lower layer vias or the further lower interconnect layer or element. In other words, a multilayer structure cannot be realized.

FIG. 2B shows an example of a mark structure for use in standard metal multilayered interconnects. As well as the vias in the device region, metal interconnects 24 are formed through a barrier metal 23, within the mark grooves 33 in the dicing region. Since in this case, the alignment marks are each formed wider than the vias in the device region, the mark grooves 33 remain as steps even when metal film formation in vias and metal film formation of the upper interconnect layer 53 are performed by, for example, CVD. Accordingly, lithography alignment of the upper interconnect layer 53 can be realized.

In the first embodiment, alignment of CNT vias and the upper interconnect layer is realized using both the mark structures shown in FIGS. 2A and 2B. More specifically, first alignment marks are formed in the dicing region of the substrate 10 near the CNT vias by embedding CNTs 43 in the mark grooves 32. Further, second alignment marks are formed in the dicing region remoter from the CNT vias than the first alignment marks by providing the upper interconnect layer 53 along the wall surfaces of the mark grooves 33. The CNT vias and the first and second alignment marks are formed in the same layer.

In the above structure, the second alignment marks can be used as reference portions when patterning the upper interconnect layer 53, which enhances the alignment accuracy of the CNT vias and the upper interconnect layer 53. Thus, in the first embodiment, high alignment accuracy can be realized between the CNT vias and the upper interconnect layer, thereby enhancing the reliability of the multilayered structure using the CNT vias.

Second Embodiment

A description will hereinafter be given of a method of manufacturing the semiconductor device shown in FIG. 1, according to a second embodiment. FIGS. 3A to 3G are cross-sectional views showing a process of manufacturing a semiconductor device according to the second embodiment.

Figure 3A:
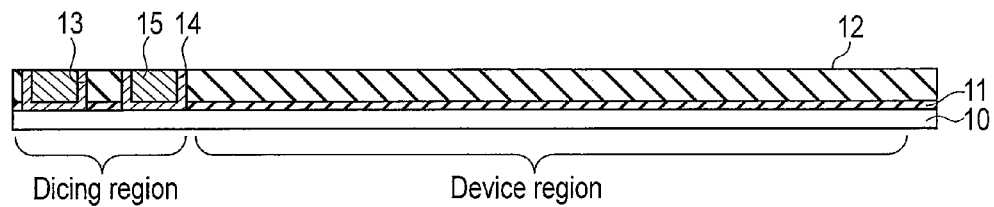
FIGS. 3A to 3G are cross-sectional views showing a process of manufacturing a semiconductor device according to a second embodiment.

Firstly, as shown in FIG. 3A, a lower interconnect layer or element, to which vias are connected, is formed. More specifically, on the Si substrate 10 with transistors, capacitors, etc., a stopper insulating film 11 formed of, for example, SiN, and an interlayer insulating film 12 formed of, for example, $SiO_2$, are provided. Subsequently, interconnect grooves 13 are formed in the interlayer insulating film 12, and a lower interconnect layer comprising a barrier metal 14 and an interconnect metal 15 is embedded in each interconnect groove 13.

Figure 3B:
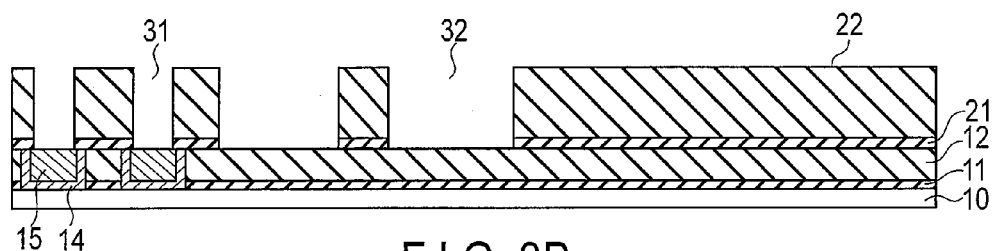

After that, as shown in FIG. 3B, a stopper insulating film 21 formed of, for example, SiN, and an interlayer insulating film 22 formed of, for example, $SiO_2$, and having a thickness of 300 nm, are provided. Subsequently, contact grooves 31 for connecting a lower interconnect layer, and first mark grooves 32 for alignment, are formed in the interlayer insulating film 22 and the stopper insulating film 21 by lithography and reactive ion etching (RIE). The contact grooves 31 are formed to a width of, for example, 100 nm so that they are connected to the lower interconnect layer in the device region. The mark grooves 32 are formed in the dicing region. Further, the mark grooves 32 are formed wider than the contact grooves 31, for example, to a width of 1 µm.

Figure 3C:
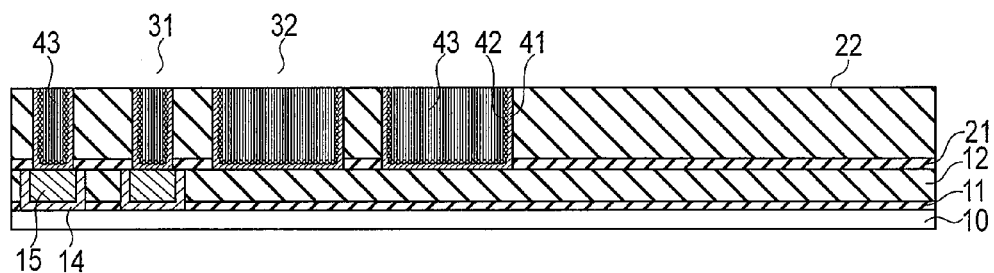

Thereafter, as shown in FIG. 3C, an auxiliary catalytic layer (of Ti, TiN or the like) 41 for CNT growth, a catalytic metal (Ni, Co or the like) 42 and CNTs 43 are embedded in each of the grooves 31 and 32.

Figure 4A:
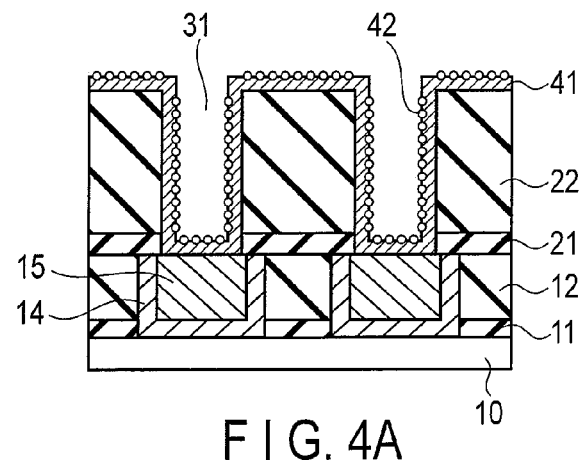
FIGS. 4A to 4C are cross-sectional views showing a CNT embedding process employed in the second embodiment.
Figure 4B:
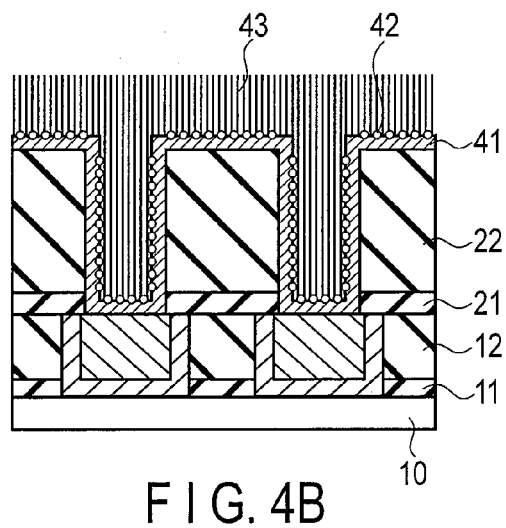
Figure 4C:
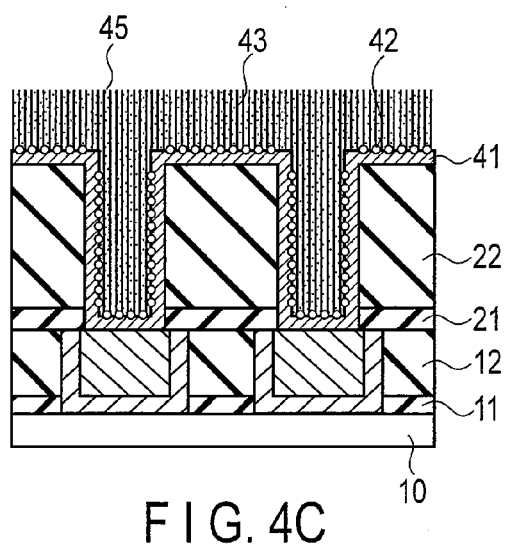

The embedding of CNTs is performed as shown in FIGS. 4A to 4C. Although FIGS. 4A to 4C show only the portion including the contact grooves 31, the portion including the first mark grooves 32 is formed in the same manner.

Firstly, as shown in FIG. 4A, an auxiliary catalytic layer (of Ti, TiN or the like) 41 for CNT growth, a catalytic layer (formed of Ni, Co or the like) 42 are formed in each contact groove 31. As shown in FIG. 4A, the auxiliary catalytic layer and the catalytic layer are formed in each groove 31 and on the entire surface of the other fields. Further, in each groove 31, these layers are formed along the wall surfaces (bottom and side surfaces). The material of the catalytic layer 41 is not limited to Ti or TiN, but may be Ta, Ti, Ru, W, Al, or a nitride or oxide thereof. The material of the catalytic layer 42 is not limited to Ni or Co, but may be a metal, such as Fe, Ru or Cu, or an alloy containing one of these metals, or a carbide thereof.

Subsequently, as shown in FIG. 4B, CNTs 43 are grown from the catalytic layer 42 by CVD. As a carbon source for forming CNTs by CVD, a gaseous hydrocarbon, such as methane or acetylene, or a gaseous mixture of such hydrocarbons, is used, and hydrogen or a noble gas is used as a carrier gas. The treatment temperature is set to, for example, 500° C. Since CNTs 43 are grown from the auxiliary catalytic layer and the catalytic layer, they are basically grown over the entire wafer surface as shown. After growing the CNTs 43, Br, Cl or N, may be implanted so as to further reduce the resistance of the CNTs.

After that, as shown in FIG. 4C, an SOG ($SiO_2$ coating) 45 is coated for the purpose of eliminating CNTs 43 grown in an extra region other than the region of the grooves 31. By introducing $SiO_2$ into the CNTs, the CNTs 43 are fixed by the SOG 45.

Thereafter, using a CMP process for isolating CNT vias, the surface of the resultant structure is flattened. At this time, CMP conditions are adjusted to make the polishing rate between the CNTs 43 and the SOG 45 close to 1:1, in order to uniformly polish the CNTs 43 and the SOG 45. By performing polishing under this condition, the structure shown in FIG. 3C is obtained.

Figure 3D:
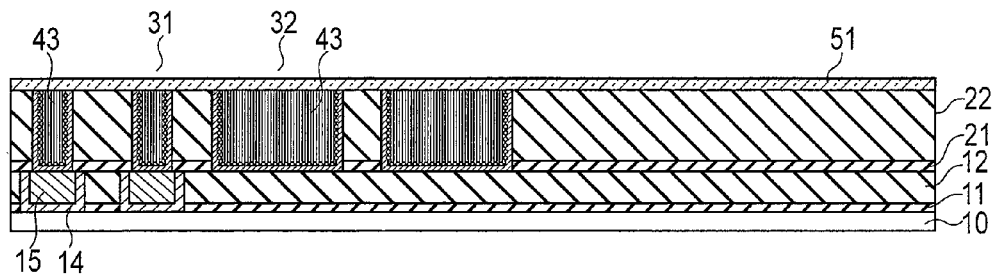

After performing CMP polishing on the CNT vias, a contact layer 51 with a thickness of, for example, 30 nm is formed on the entire surface of the substrate 10 with the CNT vias, as is shown in FIG. 3D. As the contact layer 51, it is desirable to use a material that exhibits a good ohmic contact with the CNT vias, i.e., a nitride or oxide of Ti, Ni or Co. For instance, TiN, TiO, NiN, NiO, CoN or CoO can be used. The film thickness of the contact layer 51 is set to a value that enables alignment light during lithography to pass through the contact layer 51 to thereby enable color discrimination of the CNT vias. Further, the degree of transparency of the contact layer 51 varies if the degree of nitridation or oxidation of the layer is controlled. Accordingly, the transmission distance of light can be controlled by adjusting the degree of nitridation or oxidation of the contact layer 51 or the film thickness of the same.

In general, multilayered CNTs have a low transmittance of light and is seen black. In contrast, a film of, for example, $SiO_2$ used as the interlayer insulating film 22 is transparent. Therefore, the alignment mark formed of embedded CNTs cannot provide a contrast as a step, but can easily provides a contrast as a chromatic aberration. Accordingly, even if the CNT via surfaces are coated with the contact layer 51 capable of transmitting alignment light, before a metal film serving as an upper interconnect layer is formed, the first mark grooves 32 can be recognized as the alignment marks.

Figure 3E:
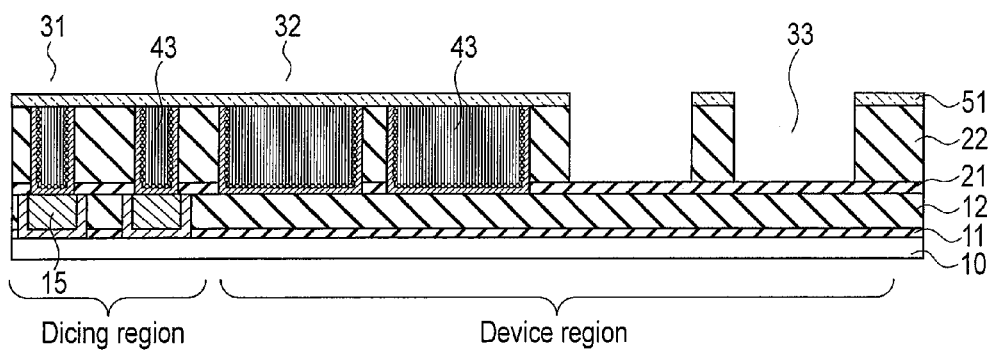

After that, as shown in FIG. 3E, the second mark grooves 33 are formed by processing the contact layer 51 and the interlayer insulating film 22 in the dicing region. The mark grooves 33 have the same width as the mark grooves 32, for example, a width of 1 μm. At this time, since alignment light passes through the contact layer 51, the mark grooves 32 can be recognized as the alignment marks. Based on the alignment marks, lithography can be performed.

The mark grooves 32 are formed wider than the contact grooves 31, and the first alignment marks are wider than the CNT vias. Therefore, the first alignment marks can be effectively used as alignment reference marks for lithography. Namely, the CNT vias are small and therefore hard to use as alignment reference marks. The mark grooves 32 as the first alignment marks enables good alignment, whereby the mark grooves 33 can be formed at desired positions. Further, since the mark grooves 33 are formed after forming the CNT vias, the materials defining the mark grooves 33 are characterized in that they contain no CNTs. Also, the portions of the contact layer 51 located at the mark grooves 33 are removed when the mark grooves 33 are processed to be opened.

Figure 3F:
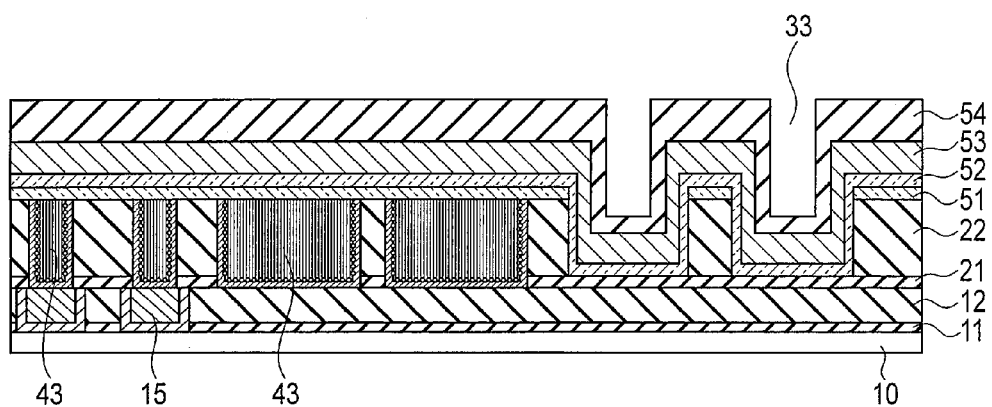

Subsequently, as shown in FIG. 3F, an adhesion layer 52 with a thickness of 10 nm is formed in the mark grooves 33 and on the portions of the contact layer 51 located at the mark grooves 33. The adhesion layer 52 is provided to guarantee adhesion and barrier properties between the contact layer 51, the interlayer insulating film 22 and an upper interconnect layer, and also serves as a contact layer. In the device region, the contact resistance of the adhesion layer 52 is included in the entire resistance of the elements. Accordingly, the adhesion layer 52 is formed of a metal, such as Ti, which has a low resistance and guarantees adhesion. If a metal film, which has sufficiently high adhesion to the contact layer 51, the stopper insulating film 21 and the interlayer insulating film 22, is formed, the adhesion layer 52 can be omitted.

Thereafter, a metal film (upper interconnect layer) formed of W, Al or Cu and serving as the upper interconnect 53 is formed on the adhesion layer 52. Since the metal film is used as the upper interconnect 53, it is formed to a thickness of 10 nm or more, for example, 50 nm, in view of interconnect resistance control. The mark grooves 33 as the second alignment marks are necessarily formed wider than the total film thickness of the metal film of the upper interconnect 53 and the adhesion layer 52. As a result, mark steps are formed by the metal film in the mark grooves 33. After that, an insulating film 54 used as a hard mask is formed on the metal film of the upper interconnect 53.

Figure 3G:
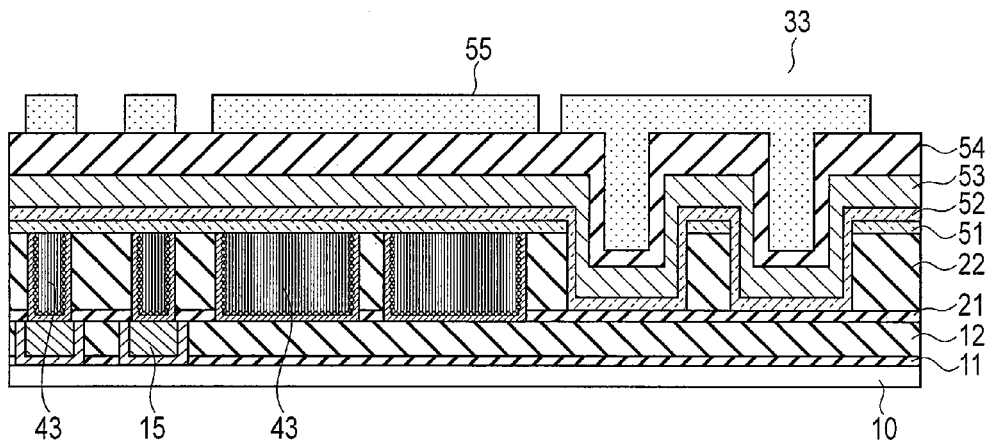

Subsequently, as shown in FIG. 3G, a resist 55 is coated on the insulating film 54, and then patterned by lithography. At this time, lithography alignment of the upper interconnect 53 is performed based on the metal film steps (second alignment marks) in the second mark grooves 33. Since the CNT via portions are flattened as shown in FIG. 3C, they cannot be recognized as CNT via marks (second alignment marks) from above because of the metal film of the upper interconnect. In contrast, the steps in the mark grooves 33 can be seen even after the upper interconnect 53 is formed. Using the steps in the mark grooves 33, the CNT vias in the device region are accurately aligned with the upper interconnect layer 53 by lithography.

After that, the insulating film 54 is selectively etched using the resist 55 as a mask, and then the metal film of the upper interconnect 53 is selectively etched by, for example, RIE, using the remaining insulation film 54 as a hard mask.

By using the first alignment marks by embedded CNTs and using the second alignment marks that contain no CNTs, the upper interconnect 53, which is accurately aligned with the CNT vias, the lower interconnect layer and the lower-layer elements, is formed as shown in FIG. 1. Thus, a multilayer structure using CNT vias is realized.

As described above, by forming, in the dicing region of the substrate, the alignment marks having a CNT structure and alignment marks without CNTs, the alignment marks without CNTs can be recognized even after the upper interconnect layer is formed. As a result, the CNT vias can be aligned with the upper interconnect with high accuracy, thereby enhancing the reliability of the multilayer structure using the CNT vias.

(Modification)

The invention is not limited to the above-described embodiments.

Although in the embodiments, CNTs are grown over the entire surface, they may be grown only within the contact grooves. Also when CNTs are grown only within the contact grooves, CNTs are also uniformly embedded in the mark grooves, the invention is also applicable to this case, and the same advantage as the above can be obtained. In order to grow CNTs only within the grooves, it is sufficient if CNTs are made to grow in a state in which the auxiliary catalytic layer and the catalytic layer are formed only within the grooves.

The materials of the auxiliary catalytic layer and the catalytic layer are not limited to those described in the embodiments, but may be changed in accordance with the specifications. Further, the film formation conditions of the auxiliary catalytic layer and the catalytic layer, and the CNT film formation conditions (CVD gas, temperature), can also be changed in accordance with the specifications.

Although in the embodiments, the second alignment marks are referred to when patterning the metal film of the upper interconnect, the lower-layer interconnect can be used as an alignment reference mark, in addition to the second alignment marks, if even at least part of the lower-layer interconnect can be seen via the metal film. In this case, alignment accuracy can be further enhanced.

The first and second alignment marks are not always formed in the dicing region of the semiconductor substrate. If there is a room in the device region, the alignment marks may be formed in the device region. Namely, parts of the device region may be provided as mark formation regions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
 a CNT via structure formed in a device region of a semiconductor substrate, formed by embedding carbon nanotubes;

a first mark formed in a mark formation region of the semiconductor substrate, formed by embedding carbon nanotubes, and formed in a same layer as the CNT via structure;

a second mark formed in the mark formation region of the semiconductor substrate, formed with no carbon nanotubes, and formed in a same layer as the CNT via structure and the first mark; and an interconnect layer formed on the CNT via structure.

2. The semiconductor device according to claim 1, further comprising a lower interconnect layer on the semiconductor substrate, wherein the CNT via structure is in contact with the lower interconnect layer.

3. The semiconductor device according to claim 1, further comprising an interlayer insulating film formed on the semiconductor substrate,
wherein the CNT via structure and the first mark are formed of carbon nanotubes embedded in the interlayer insulating film; and
the second mark is a groove formed in the interlayer insulating film.

4. The semiconductor device according to claim 1, wherein the mark formation region is a dicing region of the semiconductor substrate.

5. The semiconductor device according to claim 1, wherein the first and second marks are formed wider than the CNT via structure.

6. The semiconductor device according to claim 1, wherein each of the first and second mark is an alignment mark, and further comprising a contact layer provided between the CNT via structure and the interconnect layer, the contact layer permitting alignment light to pass therethrough.

7. A semiconductor device comprising:
a semiconductor substrate with a lower interconnect layer formed thereon, the semiconductor substrate including a device region and a mark formation region;
a CNT via structure formed in the device region of the semiconductor substrate, formed by embedding carbon nanotubes, and kept in contact with the lower interconnect layer;
a first mark formed in the mark formation region of the semiconductor substrate, formed by embedding carbon nanotubes, and formed in a same layer as the CNT via structure;
a second mark formed in the mark formation region of the semiconductor substrate, formed with no carbon nanotubes, and formed in a same layer as the CNT via structure and the first mark; and
an upper interconnect layer formed on the CNT via structure and the first and second marks, and electrically connected to the CNT via structure.

8. The semiconductor device according to claim 7, wherein each of the first and second mark is an alignment mark.

9. The semiconductor device according to claim 7, further comprising an interlayer insulating film formed on the semiconductor substrate,
wherein the CNT via structure and the first mark are formed of carbon nanotubes embedded in the interlayer insulating film; and
the second mark is a groove formed in the interlayer insulating film.

10. The semiconductor device according to claim 9, wherein the carbon nanotubes are embedded in a CNT via groove in the interlayer insulating film, with an auxiliary catalytic layer and a catalytic layer interposed, and are embedded in a first mark groove in the interlayer insulating film, with an auxiliary catalytic layer and a catalytic layer interposed.

11. The semiconductor device according to claim 7, wherein the mark formation region is a dicing region of the semiconductor substrate.

12. The semiconductor device according to claim 7, wherein the first and second marks are formed wider than the CNT via structure.

13. The semiconductor device according to claim 7, wherein each of the first and second mark is an alignment mark, and further comprising a contact layer formed between the CNT via structure and the upper interconnect layer, the contact layer permitting alignment light to pass therethrough, and being in ohmic contact with the CNT via structure.

* * * * *